US009054457B2

(12) United States Patent
Odorfer et al.

(10) Patent No.: US 9,054,457 B2

(45) Date of Patent: Jun. 9, 2015

(54) CONNECTOR FOR A SAFETY RESTRAINT SYSTEM

(75) Inventors: Frank Odorfer, Rothenbach an der Pegniitz (DE); Vincent Regnier, Nuremberg (DE); Berhard Kuehnel, Altdorf (DE); Michael Gunreben, Schwanstetten (DE)

(73) Assignee: Delphi International Operations Luxembourg S.A.R.L., Luxembourg (LU)

( * ) Notice: Subject to any disclaimer, the term of this patent is extended or adjusted under 35 U.S.C. 154(b) by 289 days.

(21) Appl. No.: 13/377,174

(22) PCT Filed: Jun. 9, 2010

(86) PCT No.: PCT/IB2010/001944

§ 371 (c)(1), (2), (4) Date: Jan. 23, 2012

(87) PCT Pub. No.: WO2010/143078

PCT Pub. Date: Dec. 16, 2010

(65) Prior Publication Data

US 2012/0112762 A1 May 10, 2012

(30) Foreign Application Priority Data

Jun. 9, 2009 (WO) .................. PCT/IB2009/006338

(51) Int. Cl.

| | |
|---|---|
| ***G01R 31/04*** | (2006.01) |
| ***H01R 13/641*** | (2006.01) |
| ***F42B 3/26*** | (2006.01) |
| ***F42C 19/06*** | (2006.01) |
| ***H01R 13/703*** | (2006.01) |

(52) U.S. Cl.

CPC ................ *H01R 13/641* (2013.01); *F42B 3/26* (2013.01); *F42C 19/06* (2013.01); *H01R 13/7033* (2013.01)

(58) Field of Classification Search

CPC ..... H01R 13/71; H01R 13/7036; G01R 31/04

USPC ......................... 324/538; 439/188; 200/51.09

See application file for complete search history.

(56) References Cited

U.S. PATENT DOCUMENTS

| | | | | |
|---|---|---|---|---|
| 4,222,623 | A * | 9/1980 | Hultberg | 439/188 |
| 5,273,448 | A * | 12/1993 | Myer et al. | 439/188 |

(Continued)

FOREIGN PATENT DOCUMENTS

| | | | |
|---|---|---|---|
| GB | 2 276 283 A | | 9/1994 |
| GB | 2276283 A | * | 9/1994 |
| WO | WO 2007/131535 | | 11/2007 |

*Primary Examiner* — Arleen M Vazquez

*Assistant Examiner* — Brent J Andrews

(74) *Attorney, Agent, or Firm* — Robert J. Myers

(57) ABSTRACT

The present invention relates to squib connectors for instance for airbag ignition systems, which allow the electrical or electronic monitoring of the correct coupling of a squib plug-connector with its corresponding counterpart. According to the invention, a squib connector has at least two terminals having corresponding signal lines. In order to allow an electrical monitoring of the correct coupling of the plug connector, the terminals are in electrical contact with each other in the uncoupled or incorrectly coupled condition of the plug connector. This electrical contact between the terminals is adapted for being separated upon correct coupling to a corresponding counter-connector either automatically or by an actuating action. The disconnecting of the terminals may then be monitored by any suitable monitoring means.

5 Claims, 13 Drawing Sheets

(56) References Cited

U.S. PATENT DOCUMENTS

Figure 1A:
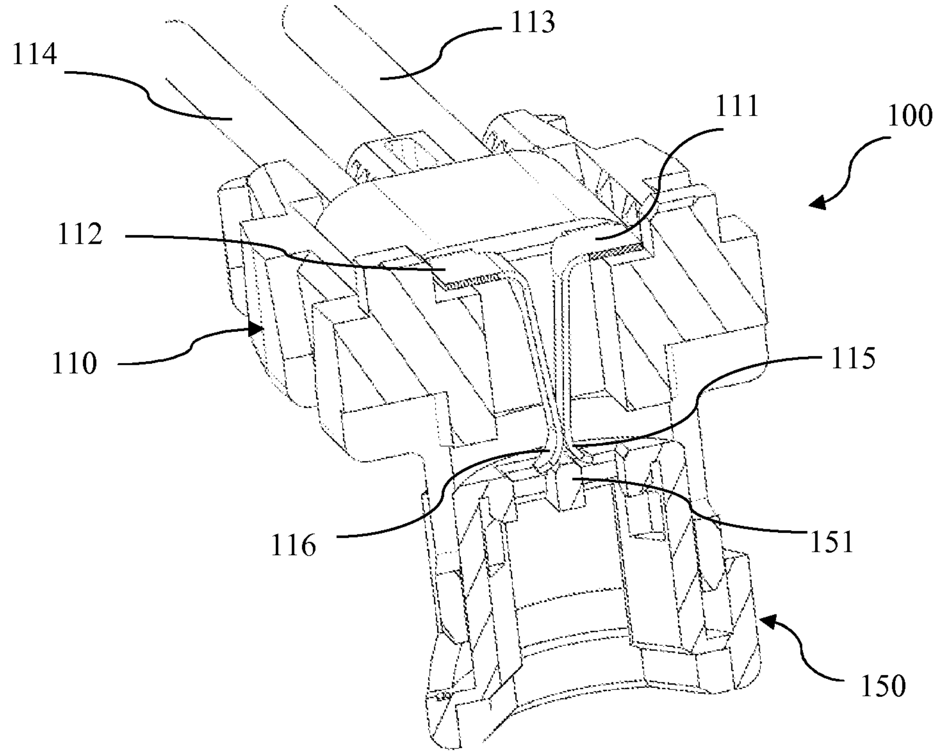

| | | | | | |
|---|---|---|---|---|---|
| 5,374,199 | A | * | 12/1994 | Chung | 439/188 |
| 5,598,624 | A | | 2/1997 | Ito et al. | 29/593 |
| 5,626,485 | A | * | 5/1997 | Clyatt et al. | 439/188 |
| 5,897,389 | A | * | 4/1999 | Dietz et al. | 439/188 |
| 2004/0043652 | A1 | * | 3/2004 | Edwards | 439/188 |
| 2006/0086900 | A1 | * | 4/2006 | Nakamura | 250/239 |
| 2008/0233778 | A1 | * | 9/2008 | Moll et al. | 439/188 |
| 2008/0233784 | A1 | * | 9/2008 | Patterson et al. | 439/278 |
| 2009/0061669 | A1 | * | 3/2009 | Diekmann | 439/188 |
| 2009/0061671 | A1 | * | 3/2009 | Qin et al. | 439/188 |

* cited by examiner

CONNECTOR FOR A SAFETY RESTRAINT SYSTEM

1. FIELD OF THE INVENTION

The invention relates to a connector for a safety restraint system (SRS), for instance to squib connectors for airbag ignition systems and in particular to plug-connectors comprising two terminals with which it is possible to electrically or electronically monitor the correct coupling of the plug-connector with a suitable counter connector.

2. TECHNICAL BACKGROUND

Passenger cars have nowadays a number of safety restraint systems, such as seat belt pre-tensioners or airbags, as e.g. front and side airbags, which serve to cushion or limit the impact of a passenger with for example interior parts of passenger cars in case of an accident. Deceleration sensors in the passenger vehicle detect high deceleration values as they occur in case of an accident and send a trigger signal via a wire or cable to SRS devices. An explosive device, known as a squib, inflates the airbag or tightens the belt. The wires or cables from the deceleration sensor are connected to an electronic control unit and then to the squib by means of a so called squib connector. To this aim, the squib is usually provided with a socket or receptacle which contains two contact pins. The squib connector comprises a plug part or plug-connector corresponding to the socket, which plug part has two receptacles for the reception of the contact pins of the squib socket. To improve the connection between squib and plug connector, retainer inserts were developed, which are adapted to fit into the receptacle of standardized squibs and which facilitate and secure the connection between squib and plug connector. These retainer inserts are commonly provided with some kind of a shorting clip, which short circuits the contact pins of the squib before a plug-connector is connected to the squib and which retainer insert further provides mechanical fastening means for a secure mechanical connection of plug-connector with the squib receptacle. The retainer inserts are sometimes also referred to as shorting inserts.

The principle structure of an (airbag) squib is for example described in WO 2004/020933. The squib disclosed in this document comprises an outer can enclosing a suitable pyrotechnic charge and an igniter which is provided with two contact pins being electrically connected to an igniter wire which can activate the charge of the squib. The igniter further includes a retainer for securing the squib to the housing of e.g. an airbag inflator, which retainer further comprises a plastic insert, which is injection moulded around the pins of the squib and which serves to provide for a mechanical fastening with the corresponding (squib) plug connector. The retainer is further provided with a so called shorting clip, which is usually an electroconductive metallic spring part, which in the non-coupled condition electrically connects the two pins of the squib with each other, i.e. shorting the same. The shorting of the contact pins serves to prevent an unintended explosion of the pyrotechnic charge due to electrical potential differences occurring between the two contact pins, for example during transport or handling. The short circuit established by the shorting clip is lifted and opens upon correct coupling of the corresponding plug-connector into or with the retainer. Usually, a contacting member of a shorting clip is displaced by the plug part of the plug-connector so that the two contact pins are no longer electrically connected.

The shorting clips of the prior art in use today are not only intended to prevent an unintentional ignition of the charge of the squib but they also serve as a control or monitoring means of the correct coupling of the squib plug-connector with its counterpart, i.e. the squib receptacle respectively the retainer or insert mounted therein. Upon correct coupling of the plug-connector with its counterpart, the short circuit between the contact pins of the squib is automatically open as described above, and this can be detected by means of suitable electrical/electronic monitoring means, as it is well known to the skilled person.

On the one hand, the necessary provision of the above described shorting clips leads to a significant increase in production costs, since not only a separate part has to be provided and assembled but also since the provision of a shorting clip in a retainer or airbag receptacle limits the design freedom for squib connectors thereby further increasing the costs since it is very often not possible to use the optimum design for plug-connector and retainer due to the necessary regard for the shorting clip.

On the other hand, constant improvements were made for the squib making it more secure. In the latest developments, modern squibs are so reliable that a shorting clip is no longer absolutely necessary. Thanks to the improvements, an unintended ignition of the charge due to an electrical potential difference between the contact pins can be ruled out. Thus, for this new type of squibs, the shorting clips could be disposed off, thereby reducing the manufacturing costs for the squib connectors considerably. However, as was mentioned above, the shorting clip is not only a safety feature for an unintended ignition of explosive charge of the airbag or belt pre-tensioner system but it is also commonly used to monitor the correct coupling of the plug-connector with its counterpart. Without a shorting clip, this is no longer possible with the existing connector systems so that shorting clips are still necessary for their monitoring function, although the "shorting function" itself is no longer strictly necessary.

It is therefore an object of the present invention to provide a connector for a safety restraint system which allows the electrical or electronic monitoring of the correct coupling of a (squib) plug-connector with its corresponding counterpart, like for example a squib receptacle or a retainer insert for a squib receptacle. It is a further object of the invention to provide a connector with such a monitoring function, which is cheaper to produce than the known connectors comprising shorting clips and which is of a more flexible construction.

These and other objects, which become apparent upon reading the following description, are solved by connectors according to claims 1 and 8.

3. SUMMARY OF THE INVENTION

According to the invention, a connector is provided comprising a plug-connector having at least two terminals having corresponding signal lines. In order to allow an electrical monitoring of the correct coupling of the plug connector, the terminals are in electrical contact with each other in the uncoupled or incorrectly coupled condition of the plug connector. Preferably, this electrical contact between the terminals is adapted, so that it can be separated upon correct coupling to a corresponding counter-connector either automatically or by an actuating action. The corresponding counter-connector is for example a receptacle of an airbag squib or a retainer associated with the squib. An automatic disconnection of the terminals is preferably achieved by a part of the counter-connector, which disconnects the contact upon full insertion of the plug connector. Alternatively, it is also possible that a manual or automated actuating action is necessary to disconnect the electrical contact. This is preferably achieved by the insertion of a connector position assurance (CPA) member, which can only be fully inserted into the plug-connector upon correct coupling of the connector parts and which mechanically disconnects the electrical contact between the terminals upon full insertion. It should be noted that the term “electrical or electronic monitoring” as used herein is intended to describe all kinds of monitoring action which makes use of electrical signals. Further, it should be noted that the term “terminals” as used herein describes all parts associated with the terminals, which are arranged inside or close to the housing of the plug connector. In other words, also parts of electrical signal lines are considered as being members of the terminals, as long as they are arranged inside or close to the plug-connector housing.

In a preferred embodiment, the electrical contact between the two terminals is established by at least one contact means, which in the uncoupled or incorrectly coupled condition of the plug-connector is in a position to electrically connect the terminals with each other and which can be disconnected upon correct coupling of the plug-connector to corresponding counter-connector. Most preferably, the disconnection of the contact means is achieved automatically upon full coupling (i.e. mating) by a mechanical contact with a part of the counter-connector. In a further preferred embodiment, the disconnection of the contact means is achieved by a full insertion of a CPA member into the plug connector. This CPA member may or may not provide further functions, as in particular the function of a secondary lock as it is known to the skilled person.

In a preferred embodiment, the contact means providing the electrical contact between the terminals is provided in form of a bendable contact tongue, which bendable contact tongue is mechanically bent out of contact upon correct coupling of the plug-connector with a counter-connector by preferably a part of the counter-connector, which interacts with the bendable tongue. Alternatively, the bendable tongue is bent out of contact by means of a CPA member being inserted into the plug connector. The contact tongue is preferably integrally formed with one or both of the terminals but it may also be provided in form of a separate, intermediate part.

In another aspect of the invention, a (preferably squib) connector is disclosed comprising a plug-connector and two terminals assigned to the plug-connector having corresponding signal lines, wherein at least one of the terminals is interrupted in the uncoupled or incorrectly coupled condition of the plug connector. For example; the two ends of the terminals, i.e. the ends intended to come in contact with pins of a corresponding counter connector and the ends being connected to the signal line, are electrically disconnected from each other and can be connected again upon correct coupling to a corresponding counter-connector. The interruption of the at least one terminal is for example closed or lifted automatically by full insertion of the plug-connector into a counter-connector, since for example a part of the counter-connector “bridges” the interruption in the terminal such that the interruption is closed. The same may be achieved by a CPA member, which is fully inserted into the plug-connector upon full coupling. In a most preferred embodiment of this aspect of the invention the terminal is interrupted and comprises contact ends at the interruption, which in the fully coupled position of the plug connector with its corresponding counter part can be bend towards each other until they contact each other thereby establishing an electrical contact. This may be achieved by a separate CPA member acting on one or both of the contact ends to urge the same into contact or by a part of the counter-connector.

The inventive construction of the squib connector allows to electrically monitor the correct coupling of the plug-connector with its corresponding counterpart without the necessity for a shorting clip according to the prior art. The inventive construction is further more cost-efficient than the provision of a shorting clip so that the solution of the present invention allows a cheaper construction for (squib) connectors which offers at the same time a reliable monitoring of the correct coupling action. With squib connectors of the present invention no additional or separate shorting clip is necessary for the squib (but the invention does not necessarily prevent from using an additional shorting clip).

4. DESCRIPTION OF THE PREFERRED EMBODIMENTS

Figure 1B:
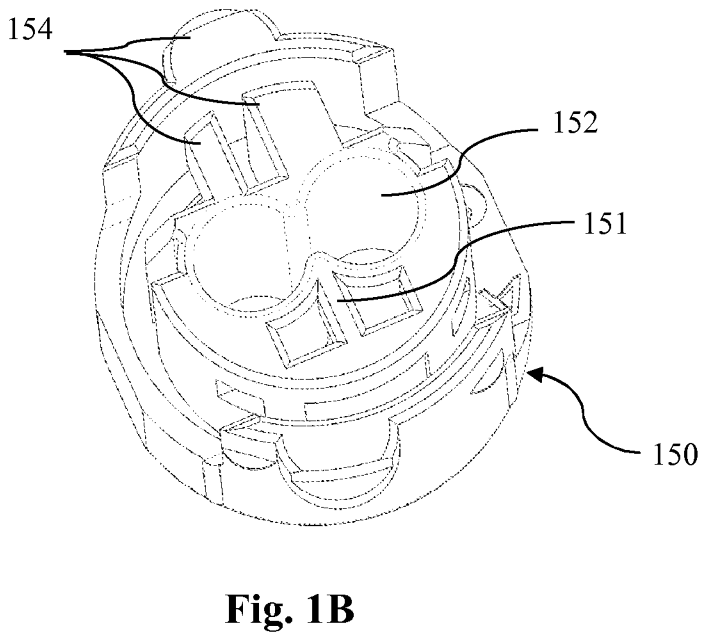
Figure 1C:
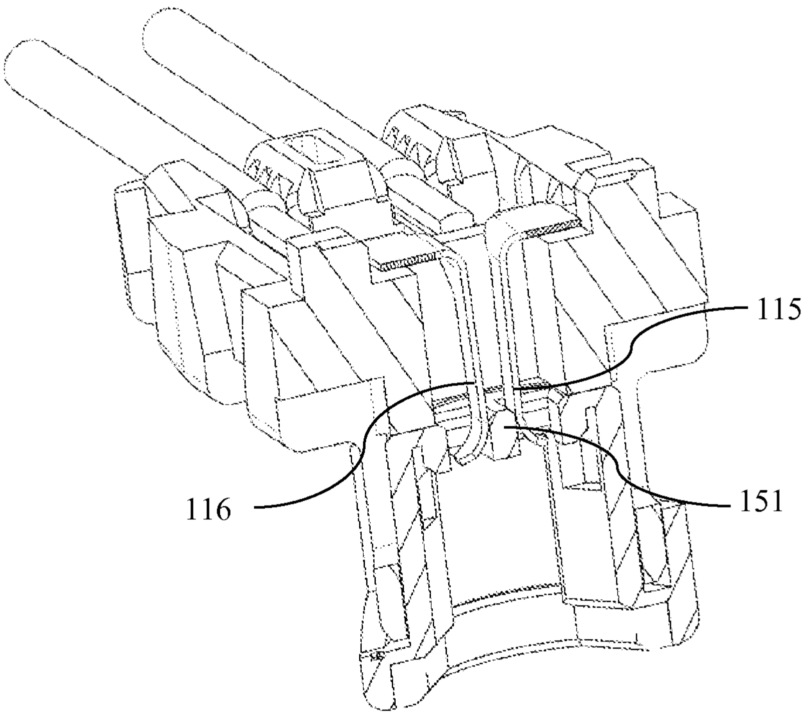
Figure 1D:
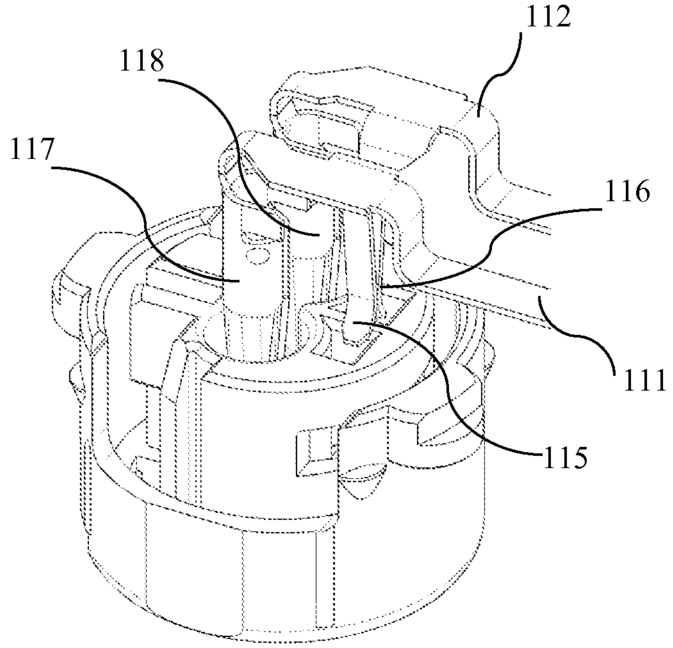
Figure 2A:
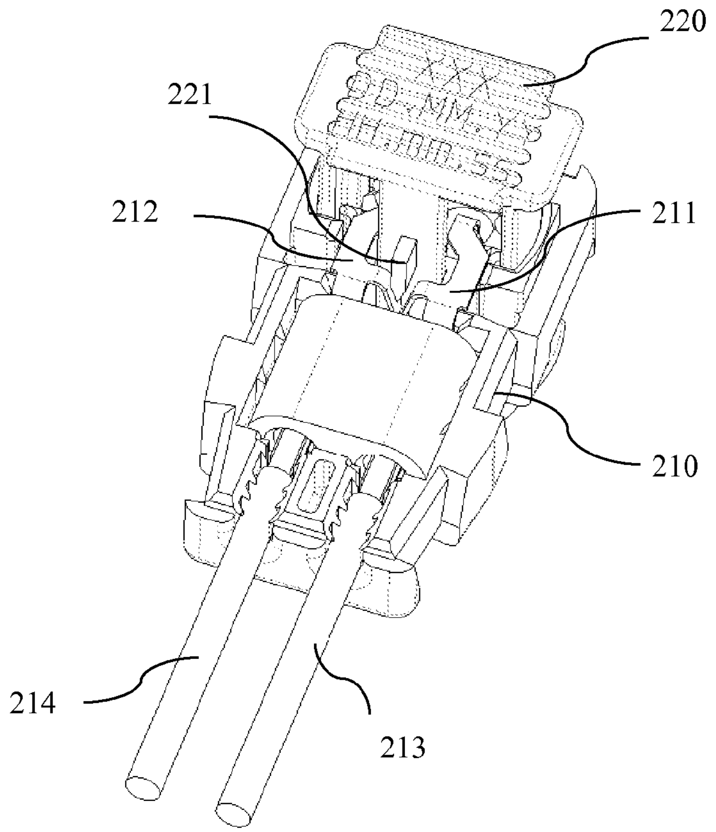
Figure 2B:
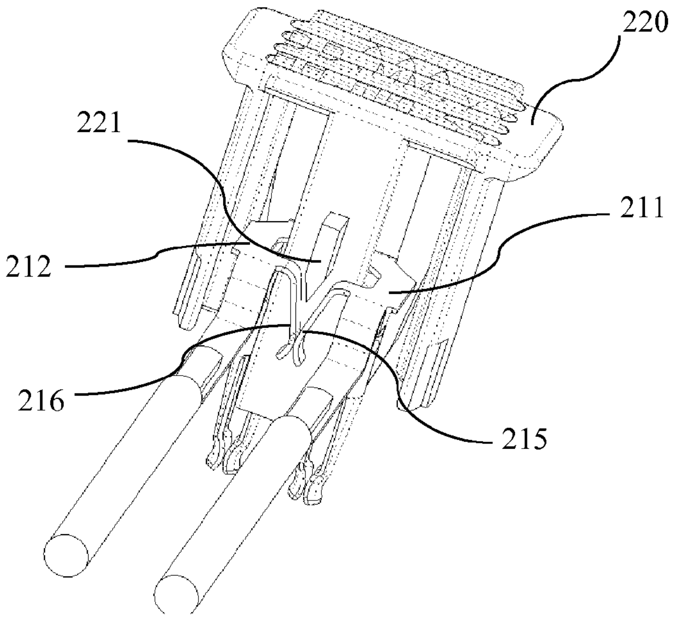
Figure 2C:
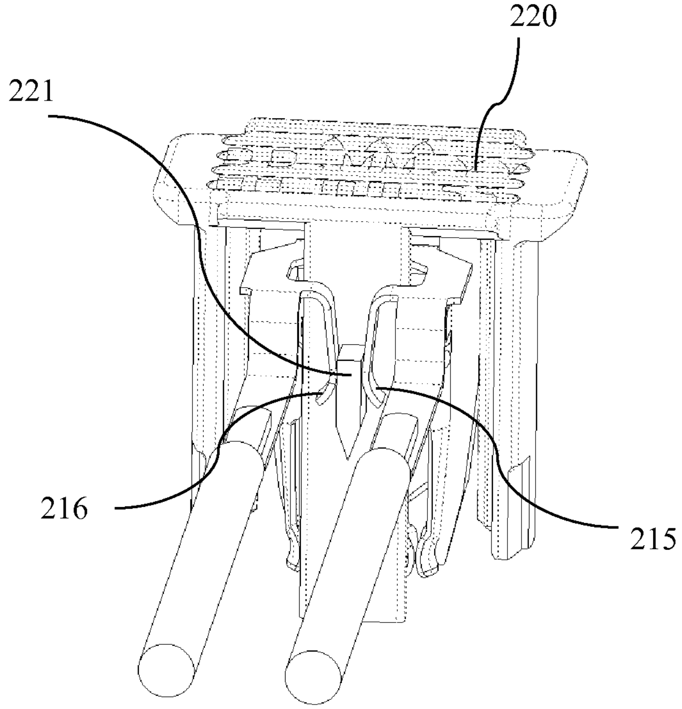
Figure 2D:
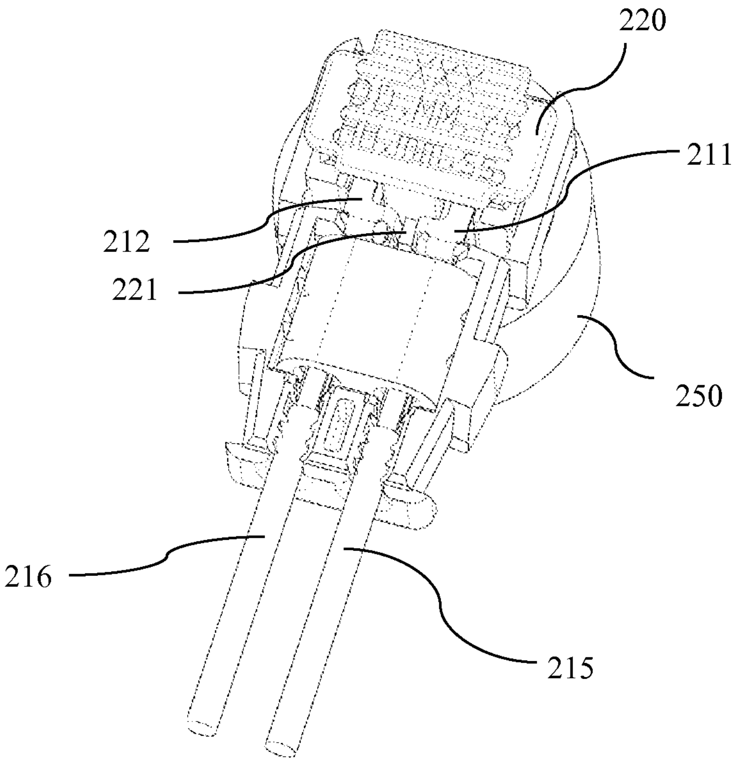
Figure 2E:
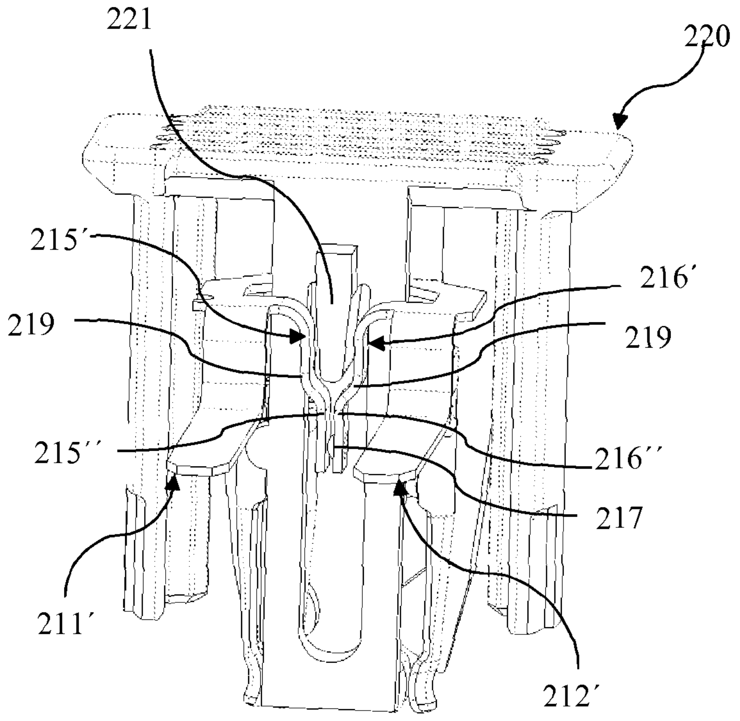
Figure 2F:
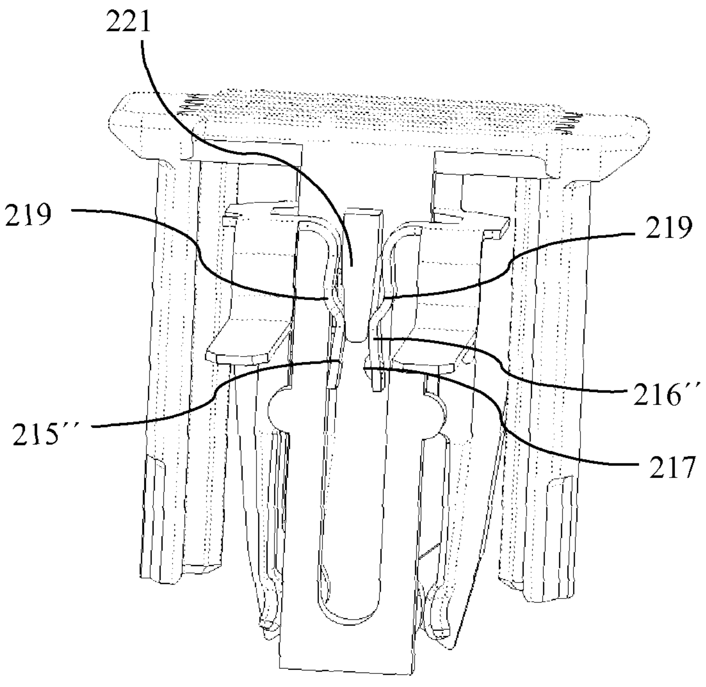

In the following the invention is described exemplarily with reference to the enclosed figures, in which:

FIGS. 1A-D show schematic illustrations of a squib connector in accordance with a first embodiment of the invention;

FIGS. 2A-D show schematic illustration of a further embodiment of the invention;

FIGS. 2E-F show an alternative arrangement of the contact means of the embodiment shown in FIGS. 1A to D;

FIGS. 3A-D show a third embodiment in accordance with the invention; d

FIGS. 4A-D show a forth embodiment in accordance with the invention;

FIGS. 5A-5D show a $5^{th}$ embodiment in accordance with the invention; and FIGS. 6A-D show a $6^{th}$ embodiment in accordance with the invention.

Throughout the figures, like components are denoted with similar reference numbers, whereby the reference numbers are three-digit and the first digit indicates the respective figure (e.g.: reference numbers 111 and 112 are used for the terminals shown in FIGS. 1A-D and reference numbers 211 and 212 are used for the corresponding terminals shown in FIGS. 2A-D)

FIGS. 1A-D show different views of a squib connector assembly 100 comprising a plug connector 110 being provided with two terminals 111, 112 having corresponding signal lines 113, 114. In the schematic illustration of FIG. 1A the squib connector is shown in a cut view and the cover closing the housing of plug connector 110 in practice is removed to allow a visualization of the components contained in the plug connector. It should be noted that all the figures are enlarged views and that the connectors are in reality in the range of several millimeters, like for example 10-20 mm. In the embodiment shown, the terminals 111, 112 are made from strips of electroconductive sheet metal and provided with contact means in the form of two bendable contacts tongues 115, 116 which are in contact with each other in the uncoupled or not completely coupled condition of the squib connector, as shown in FIG. 1A. It should be noted, that the arrangement shown in FIG. 1A shows the squib connector at the initial stage of coupling, i.e. when the plug connector 110 and squib retainer 150 are not yet coupled with each other. The two bendable contact tongues 115, 116 are integrally formed with the terminals 111, 112 as can best be seen from FIG. 1D.

FIG. 1B shows the squib retainer 150 in more detail. The retainer comprises two apertures 152 for the reception of the free ends of the terminals. The squib retainer 150 is provided with a contact opening part 151. The contact opening part 151 is provided in form of a ledge separating two further apertures of the retainer. Elements 154 are coding ribs to assure the correct mounting of the retainer inside of the squib receptacle and the mating, as well as the proper orientation, of the retainer with an appropriate squib connector. FIG. 1C shows the operation of the two contact tongues 115, 116 when the plug connector is inserted into the retainer. As one can see, due to the plug-in motion of the plug connector into retainer 150 the contact opening part 151 bends the two contact tongues 115, 116 outwardly, so as to spread them apart, thereby lifting and opening the electrical contact thereof. In the position shown in FIG. 1C the two terminals are no longer in electrical contact with each other, in other words, the short circuit between the terminals is open. By means of a suitable electronic control means it is possible to detect the open short circuit in FIG. 1C to monitor the correct coupling of the plug connector with the retainer. The skilled person working in the field of airbag connector systems is well acquainted with such monitoring means so that no detailed description thereof is given. In principle, this can for example be achieved by applying a low current to the terminals, the flow of which will be interrupted upon opening of the short circuit, which is then detectible. In the context of this application the terms "electrical" and "electronic" in particular in combination with the monitoring function, are use equivalently and shall have the same meaning, i.e. a monitoring by using electrical power.

FIG. 1D shows the terminals 111, 112 in the position shown in FIG. 1A with the housing of the plug connector 110 removed, to facilitate understanding of the principle. As one can see from FIG. 1D, the terminals are provided with free ends 117, 118 adapted to receive each a contact pin of an airbag squib. The two contact tongues 115, 116 electrically couple the terminals 111, 112 with each other, thereby short circuiting both terminals with each other.

FIGS. 2A-B show a different embodiment in accordance with the invention. In FIG. 2A a plug connector 210 is shown comprising a position assurance member (CPA) 220. The function and the operation of CPAs in the field of SRS connectors are well known to the skilled person and will therefore not be explained in detail. The plug connector 210 is shown in a schematic top view with the cover removed to allow a visualization of the components arranged inside of the connector. As with all the embodiments herein, the plug connector comprises two terminals 211, 212 to allow an electrical connection with the contact pins of a squib. Now referring to FIG. 2B, each of the terminals is provided with a bendable contact tongue 215, 216, which provides an electrical contact between the two terminals, i.e. which short circuits the terminals. The CPA member 220 is provided with a contact opening part 221 which has for instance a wedge shape and which upon full insertion of the CPA member into the plug connector housing will bend the two contact tongues 215, 216 out of contact, thereby opening the short circuit. This is shown in FIG. 2C. As the skilled person knows, CPA members can be pushed fully into the housing of a airbag squib connector, only if the airbag squib connector is fully and correctly mated with its corresponding counter part. Thus, the contact between the two terminals can only be lifted and open upon correct and full coupling of the plug connector with its counter part since only in this case it is possible to push the CPA member in the position shown in FIGS. 2C and 2D. This situation can best seen in FIG. 2D, where the plug connector 210 is fully coupled to a corresponding squib receptacle 250.

FIGS. 2E and 2F show an alternative embodiment of the contact means shown in FIGS. 2A to 2D. As one can see from the figures, the alternative contact means are formed by two bendable contact tongues 215', 216' being directed in plug-in direction. The tongue 215' is associated with terminal 211' and in electrical contact with the other with terminal 212'. Both contact tongues are provided with S-shaped portions 219 which merge into two parallel flat contact portions 215", 216". The right hand portion 216" in the figures is additionally provided with a contact protrusion 217 which is, in the position shown in FIG. 2E, in contact with the respective other contact portion 215". The CPA member 220 is identical to the one shown in FIGS. 2A to 2D and is provided with a wedge shaped contact opening part. The S-shaped portions 219 provide a particular advantageous function, since—as the skilled person will recognize from the figures—the construction shown in FIGS. 2E to 2F has a distinct point of separation. This means that already at the initial stage of contact between part 221 and the S-shaped portions 219, i.e. when part 221 is wedged only to the smallest amount between the contact tongues 215', 216', the contact protrusion 217 will be safely lifted out of contact with the contact portion 215". This is due to the leverage effect provided by the S-shaped portions 219, the parallel contact portions 215", 216" directly adjacent thereto and the contact protrusion 217 remote from the initial contact point between part 221 of CPA 220 and the contact tongues. Thus, the alternative construction described in FIGS. 2E to 2F offers an improved security compared to e.g. the construction of FIGS. 2A to 2D.

Figure 3A:
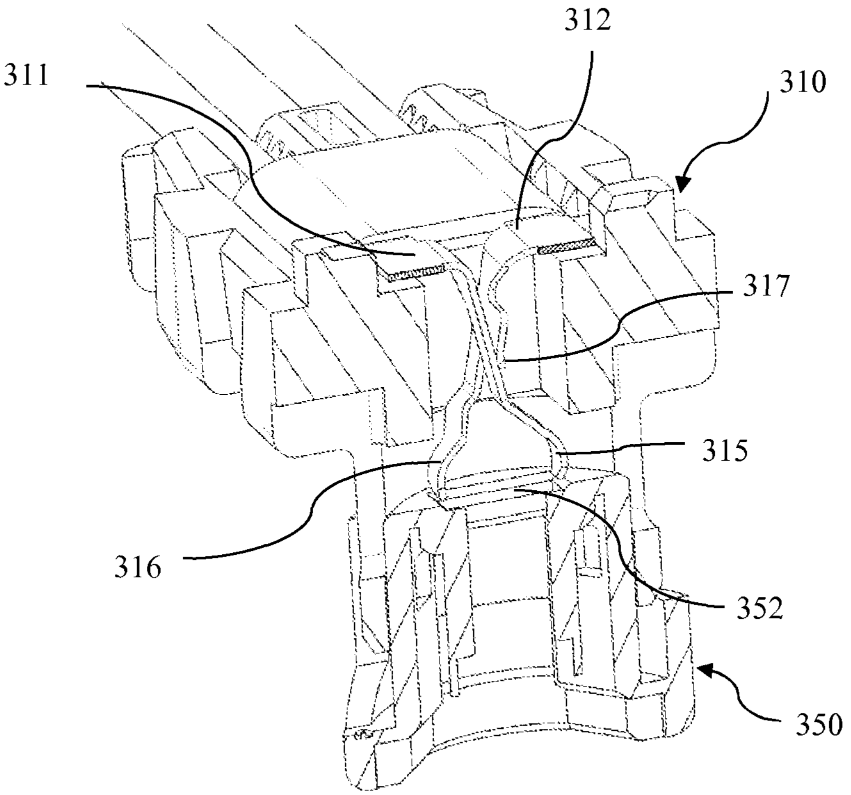
Figure 3B:
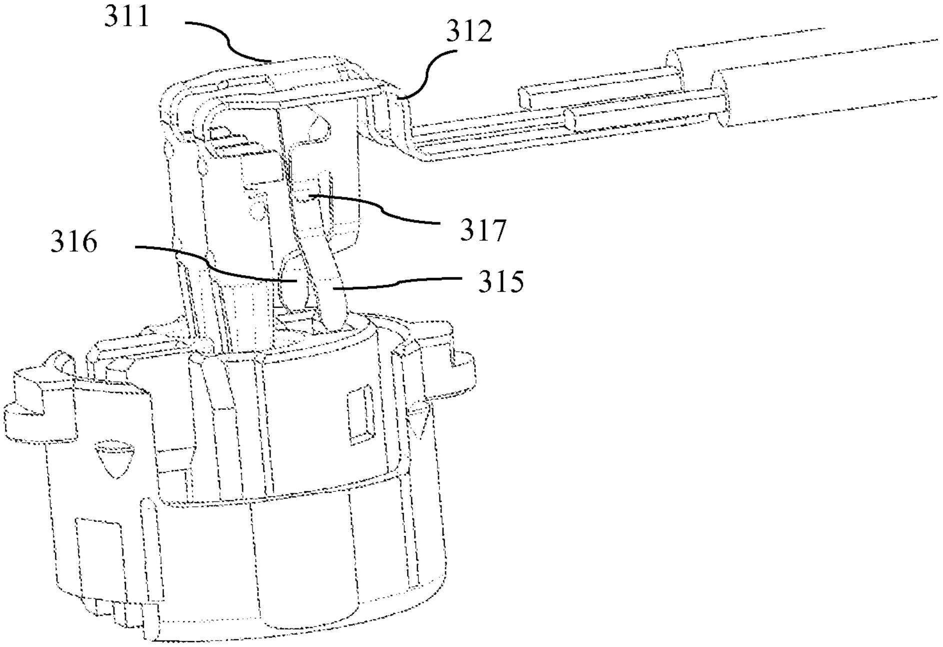
Figure 3C:
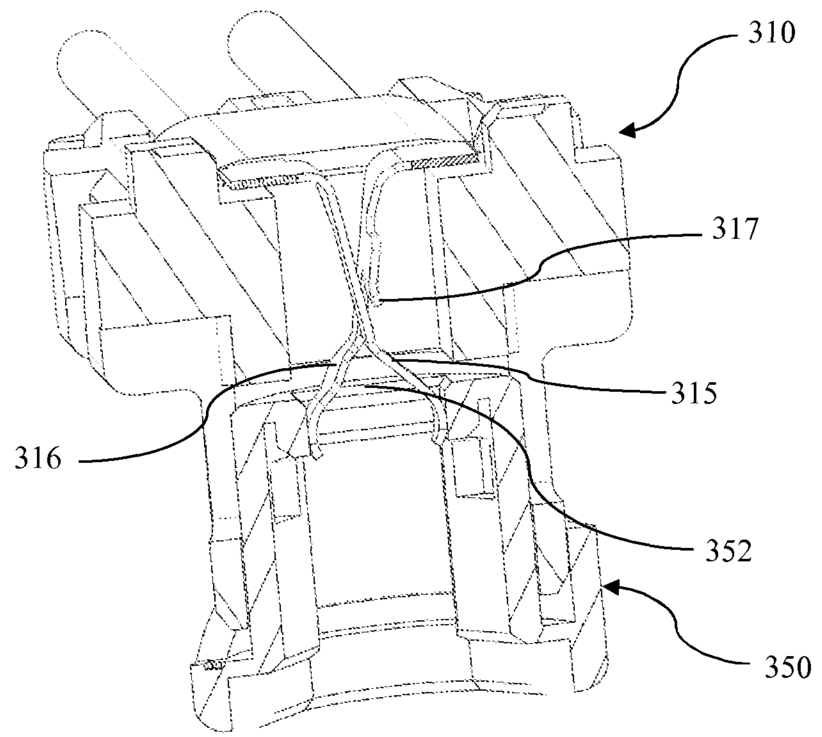
Figure 3D:
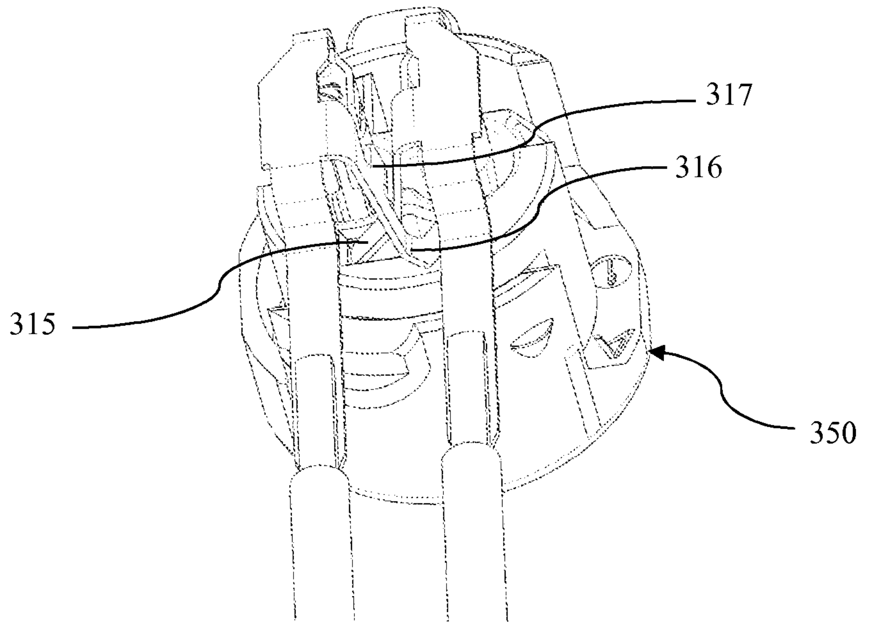

FIGS. 3A-3D show another preferred embodiment of the invention having a plug connector 310, which is insertable into an airbag retainer 350. The retainer 350 is provided with a rectangular aperture 352 adapted to receive contact means of the terminals 311, 312, which are provided in from of two bendable contact tongues 315, 316. As the contact tongues shown in the embodiments of FIGS. 1 and 2, the bendable contact tongues 315, 316 are being oriented essentially in plug-in direction. However, in the embodiment of FIG. 3, the two contact tongues are arranged further in an x-shape orientation with respect to each other. In the arrangement shown in FIG. 3A—in which the plug connector is not yet coupled to the corresponding retainer 350—both tongues are in electrical contact with each other due to a separate contact tongue 317 arranged parallel to contact tongue 315. This can be also seen from the illustration of FIG. 3B. Upon insertion of the plug connector into the retainer, both contact tongues 315, 316 are pushed into the aperture 352 of the retainer 350 and, since the width of the aperture 352 is smaller than the distance of the free ends of the contact tongues 315, 316, the same will be moved towards each other. This can best seen from FIG. 3C, in which the separate contact tongue 317 is lifted from the contact tongue 315, thereby lifting the electrical contact between the two terminals. FIG. 3D shows the arrangement of FIG. 3B from a different perspective. It should be noted, that in FIGS. 3B and 3D the plug connector housing is removed to allow a better visualization of the function of the terminals and the contact tongues. The skilled person will recognize, that also the arrangement of FIG. 3 may as well be used with a CPA member in accordance with the function described in connection with FIG. 2. In other words, instead of bending the contact tongues towards each other by means of an aperture provided in the retainer, it is also possible to provide a CPA member with for example a wedge shaped contact opening part, which bends the two contact tongues out of contact.

Figure 4A:
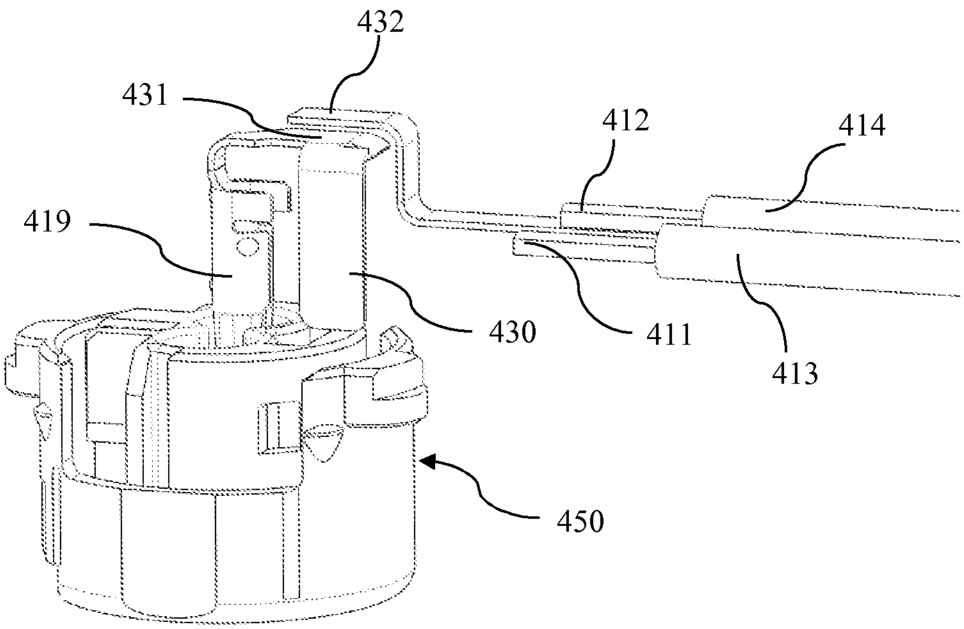
Figure 4B:
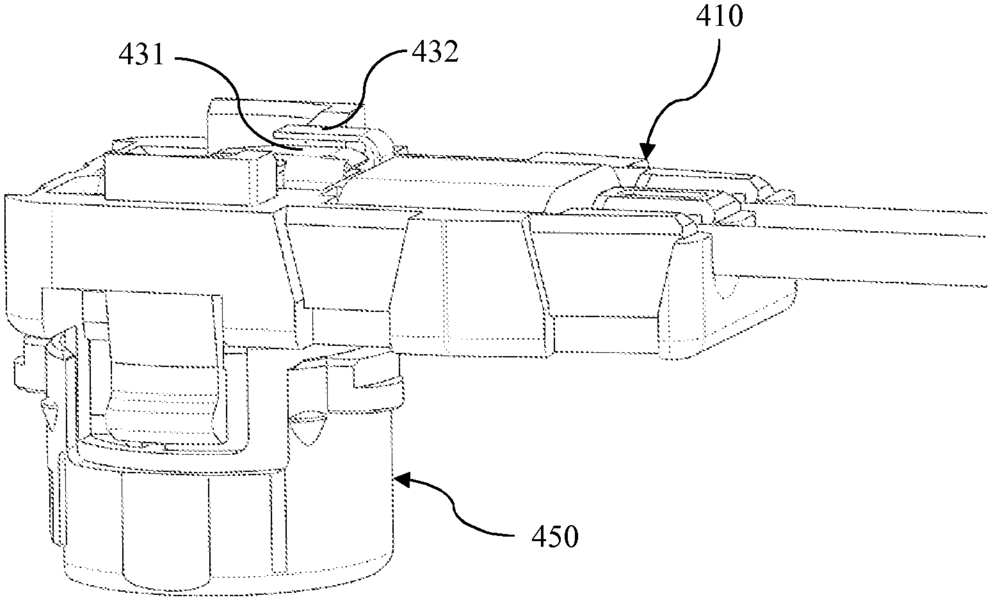
Figure 4C:
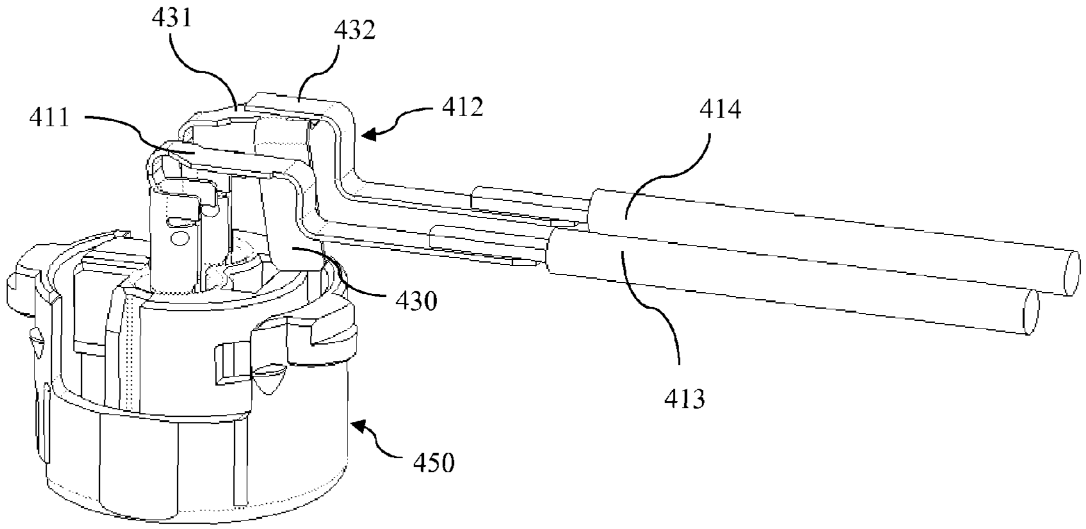
Figure 4D:
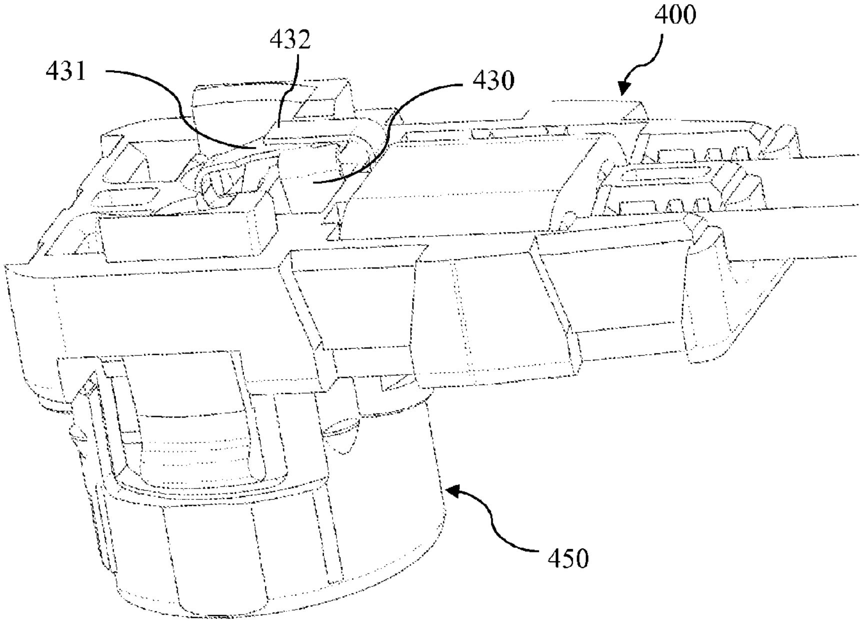

FIGS. 4A-4D show yet another preferred embodiment of the present invention. FIG. 4A shows another embodiment of terminal 412, which is interrupted, i.e. in the position shown in FIG. 4A no electrical contact exists between the associated signal line 414 and the free end 419 of the terminal, which is arranged partially inside of a retainer 450 in FIG. 4A. The second terminal 411 is not completely shown to allow a better view of the interrupted terminal 412. In other words, terminal 412 consists of two parts which are in the not coupled condition shown in FIG. 4A not in electrical contact with each other. Both parts comprise contact ends 431 and 432, which in the fully coupled position of the plug connector with its corresponding counter part 450 can be bent towards each other thereby establishing an electrical contact. To achieve this, the left part of terminal 412 in FIG. 4A is provided with an actuating member or tongue 430, which actuating member is actuated upon correct coupling of the plug connector to a corresponding counter connector thereby "bridging" the interruption of the terminal and bringing the free end 419 of the terminal and the signal line 414 in electrical contact with each other. FIG. 4B shows the plug connector 410 partially inserted into retainer 450. As one can see from the figures, the contact portions 431 and 432 of the interrupted terminal 412 are not yet in contact with each other. FIGS. 4C and 4D illustrate what happens, when the plug connector is fully inserted into the retainer 450. In the illustration of FIG. 4C, the housing of the plug connector is again removed to visualize the function of the interrupted terminal. As one can see from FIG. 4C, a part of retainer 450 is in mechanical contact with the actuating member or tongue 430, whereby the actuating tongue 430 is automatically pushed upwards upon inserting of the plug connector into the retainer, thereby establishing an electrical contact between contact portions 431 and 432. In the embodiment shown in the figures, the contact tongue 430 is integrally formed with contact portion 431 and the free end 419 of the terminal, however it is clear to the skilled person that also further intermediate parts may be provided with the connector assembly, as long as the insertion of plug connector into the retainer will lead to a closing of the interruption of the terminal.

As one can further see from FIG. 4C, the second terminal 411 is not interrupted but in continuous connection with the corresponding signal line 413. Obviously, also this second terminal 411 may be provided with an interruption similar to the interruption of terminal 412. However, for a monitoring or detection of a correct coupling of the plug connector with its counter part, one interrupted terminal is sufficient. Further, as the skilled person will recognize, the principle shown in FIG. 4 may also work with a CPA member. In this alternative, no actuating member or tongue 430 is necessary, but the CPA member may push the upper contact portion 432 into contact with the lower contact portion 431 upon full insertion into the plug connector housing. Thus, with the embodiment of FIG. 4, the interruption of the terminal can be connected either automatically due to a contact of the actuating member with the retainer or by a separate actuating action, namely by for example inserting a CPA member after complete mating of the two connector members.

Figure 5A:
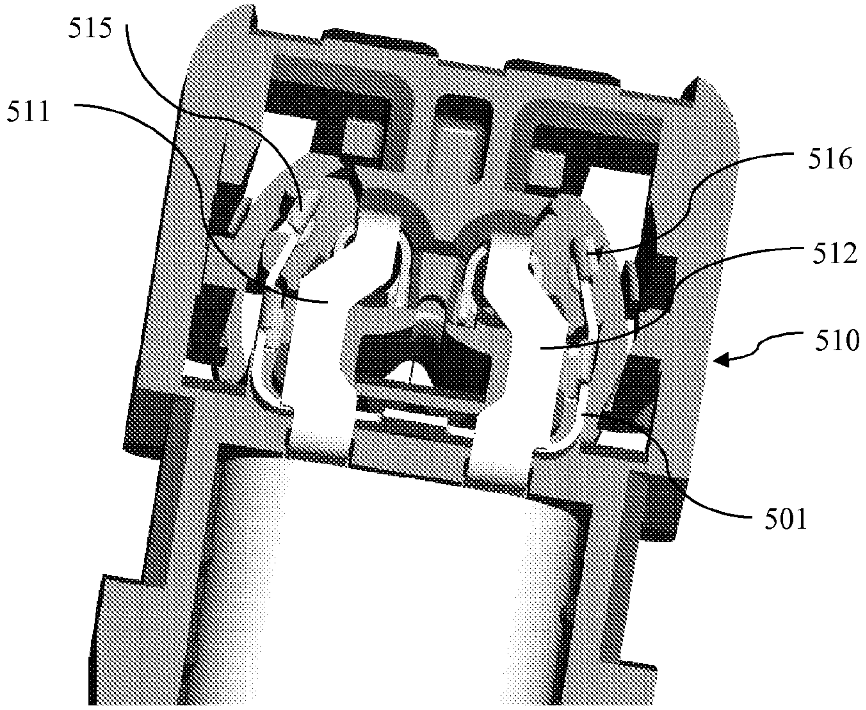
Figure 5B:
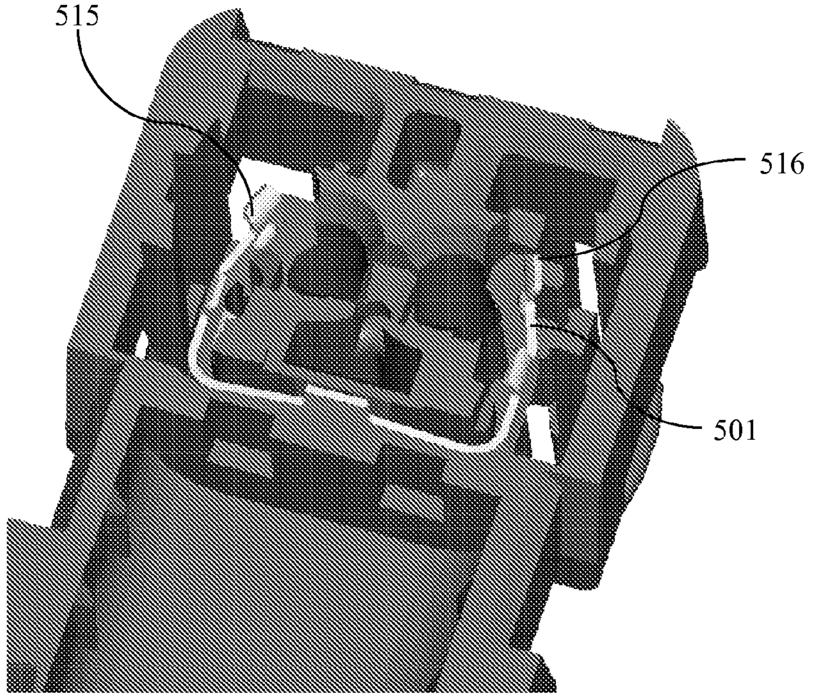

FIGS. 5A to 5D show another preferred embodiment in accordance with the invention. FIG. 5A shows a detail of a plug connector 510 with the cover of the connector removed. Also in this case two contact terminals 511, 512 are provided inside of the plug connector 510. A contact means 501 is provided in form of a metal part, which is shaped in a general U-shape configuration. The contact means in the position shown in FIG. 5A does not contact the terminals and the terminals are thus not in electrical contact with each other, i.e. they are not short-circuited. The structure of the contact means 501 can better be seen from FIG. 5B in which the contact terminals are removed. The contact means 501 comprises two contact tongues 515, 516, which are shaped such that they will not contact the terminals in their idle, non-bent position as shown. As will be explained in more detail with reference to FIGS. 5C and 5D below, both contact tongues 515, 516 will be pressed against the metallic sides of the terminals 511, 512 upon partial insertion of a CPA member into the plug connector 510.

Figure 5C:
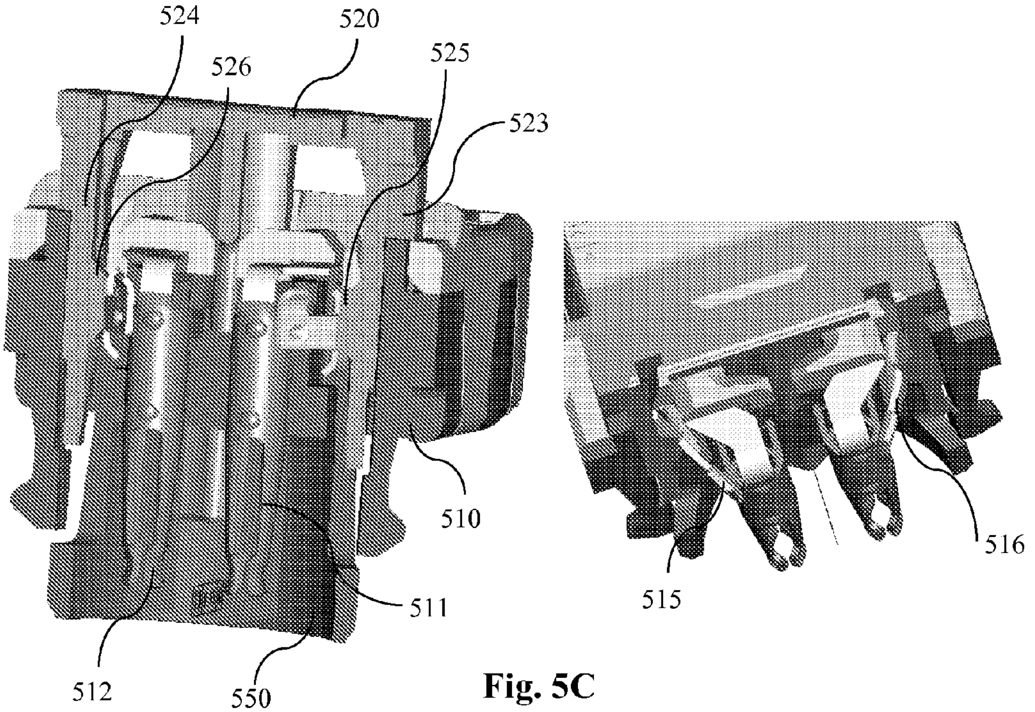
Figure 5D:
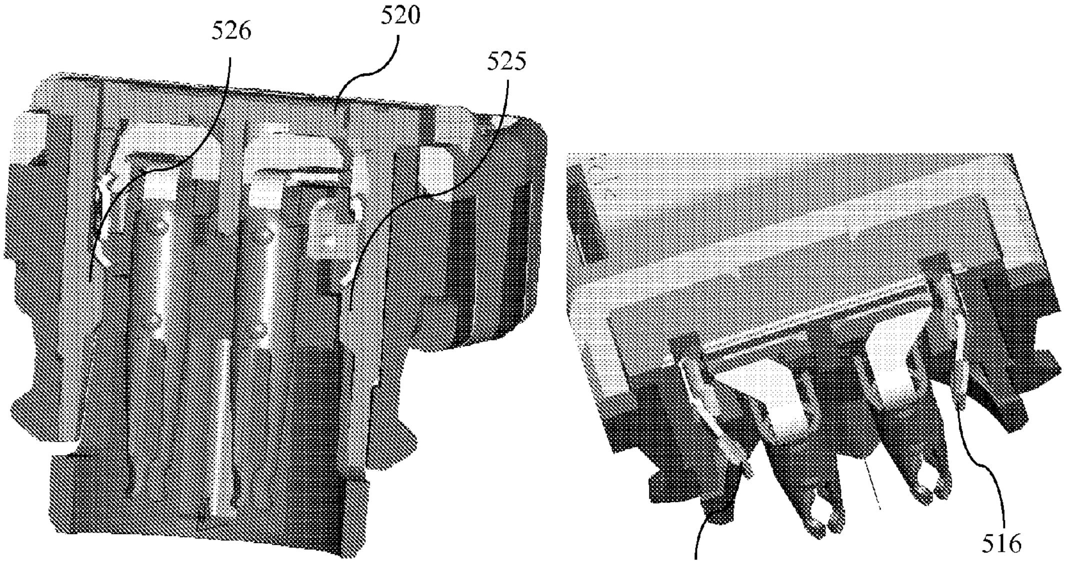

FIG. 5C shows two perspective partially cut front views of the plug connector 510 with the cover of the connector attached to the main body thereof. From FIG. 5C one can clearly see the CPA member 520, as it is partially inserted into the plug connector housing. The CPA member 520 comprises two actuating arms 523, 524 being provided with actuating projections 525, 526, which interact with the contact tongues 515, 516 of the contact means 501. In the position shown, the actuating projections 525, 526 press the contact tongues 515, 516 into electrical contact with terminals 511, 512, so that both terminals are short-circuited with each other via the contact means 501. The contact between the contact tongues and the terminals may best be seen from the right hand illustration of FIG. 5C. In FIG. 5D, the CPA member 520 is shown in its finally closed condition. Here, the actuating projections 525, 526 are no longer pressing the contact tongues 515, 516 towards the terminals and the electrical contact between both terminals is thus released. This can best be seen from the right hand illustration of FIG. 5D. Since it is only possible to move the CPA member 520 into the fully closed position shown in FIG. 5D upon full and correct mating of the plug connector 510 with its corresponding plug socket 550, the short circuit between the terminals can only be released if the full mating is completed. This release of the short circuit can be detected as was explained above and thus the mating process can be monitored by means of suitable control equipment.

Figure 6A:
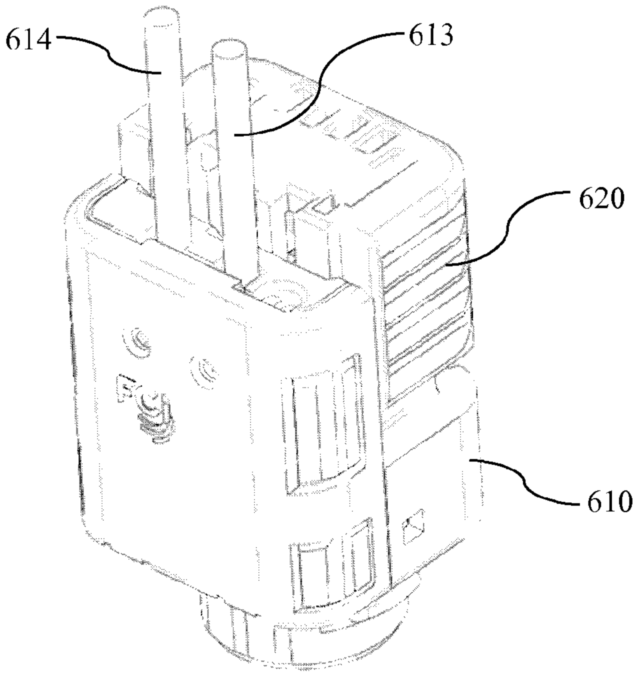
Figure 6B:
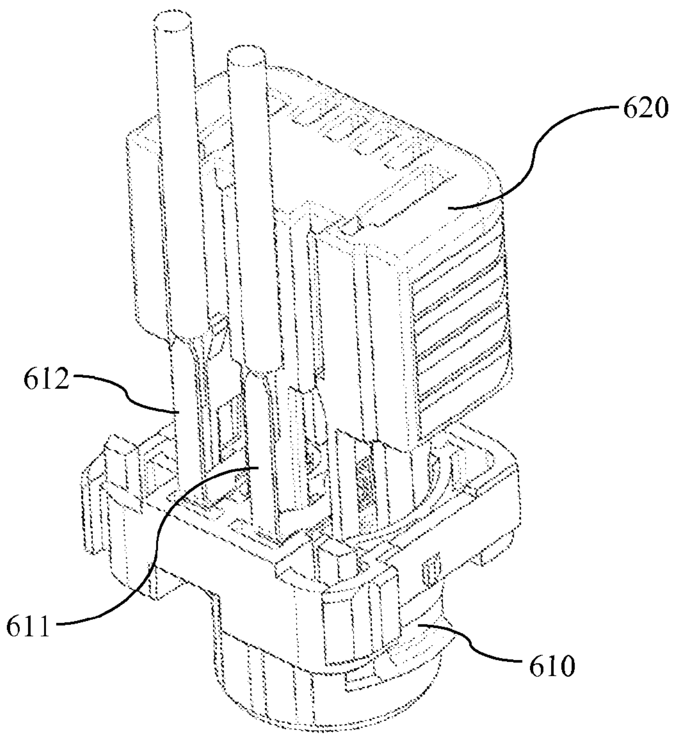
Figure 6C:
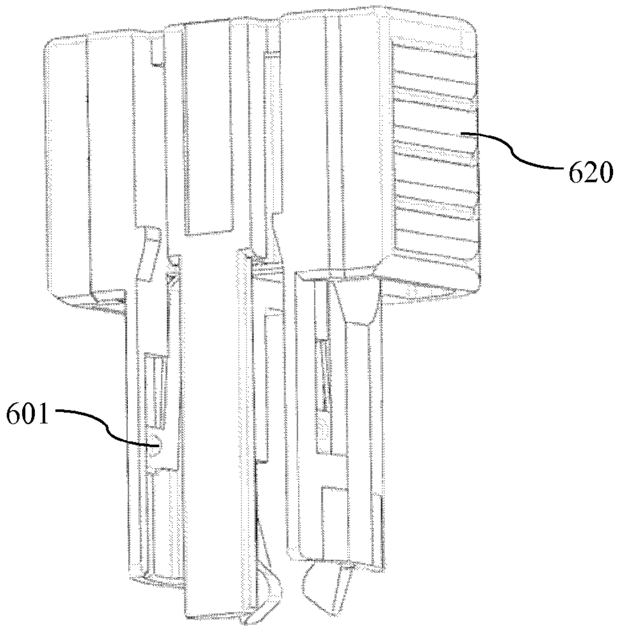
Figure 6D:
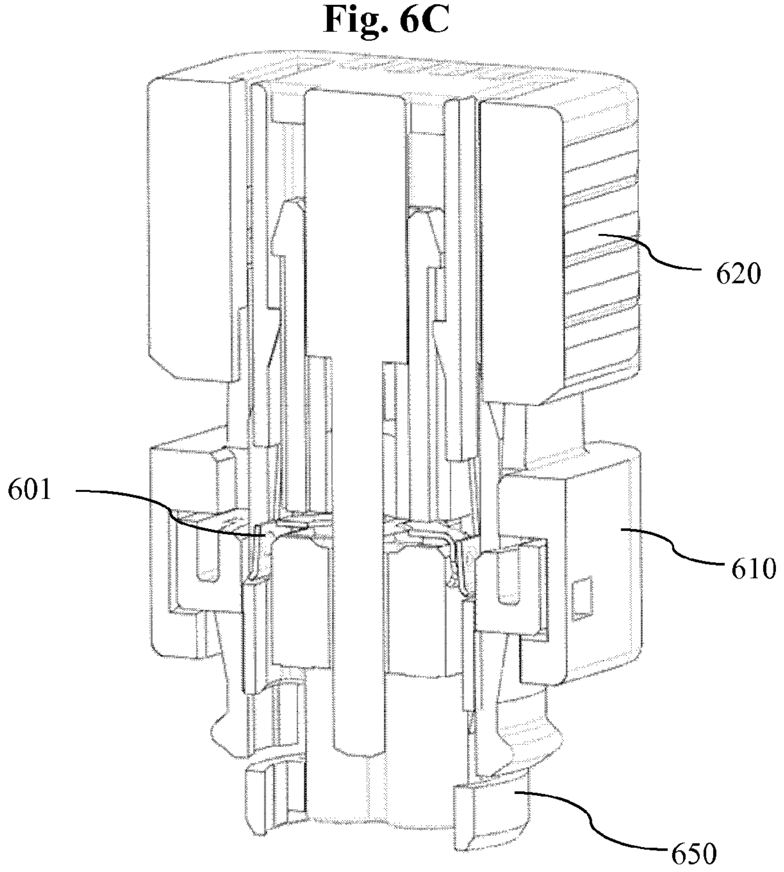

FIG. 6A shows another example of a plug connector 610 being provided with an additional CPA member 620. In FIG. 6A, the CPA member 620 is shown in a pre-locked position. One can further see two signal lines 613, 614 which are associated with corresponding contact terminals 611, 612 that are arranged inside of plug connector 610. This arrangement can best be seen in FIG. 6B, in which the cover part of the plug connector 610 is removed to show the interior construction of the connector. In the embodiment of FIGS. 6A to 6D, the contact means is provided inside or attached to the CPA member 620. This may best be seen in FIG. 6C, which shows the contact means 601, which has basically a U-shaped configuration and is made from a piece of bent sheet metal Contact means 601 is fastened to the corresponding arms of the CPA member. The contact means 601 and the CPA member 620 are designed so that in the pre-locked condition shown in FIG. 6A, the contact terminals 611, 612 are in contact with the contact means 601 and thus short-circuited thereby. This situation is shown in the cut perspective view of FIG. 6D. Upon full insertion of the CPA member, i.e. upon moving the CPA member 620 into its finally locked position, the electrical contact between contact means 601 and contact terminals 611, 612 is released. Again, since it is only possible to move the CPA member into its final locked position if the plug connector 610 is fully mated with a corresponding counter connector, the inventive construction enables a remote control and monitoring of the mating process by means of a suitable control circuitry, which detects the presence and release of the short-circuit of the two contact terminals.

The invention claimed is:

1. An electrical connector, comprising:

a plug connector including a first and second terminal contained within the plug connector, the first terminal defining a first bendable contact tongue and the second terminal defining a second bendable contact tongue, each contact tongue depending from the respective terminals diagonally essentially in a plug-in direction, whereby the two contact tongues are arranged in an X-shape orientation with respect to each other, wherein the first and second contact tongue are in electrical contact with each other in the uncoupled or incorrectly coupled condition of the plug connector, thus electrically connecting the first and second terminals; and a retainer separate from the plug connector and defining an aperture configured to engage free ends of the first and second contact tongues within said aperture, wherein a distance between the free ends of the first and second contact tongues in the uncoupled or incorrectly coupled condition is greater than a width of a portion of the aperture, wherein when the plug connector and the retainer are in the mated condition, the engagement of the free ends of the first and second contact tongues squeezes the contact tongues towards each other, thereby moving the first and second tongues out of contact with each other and thus electrically disconnecting the first and second terminals.

2. The connector according to claim 1, wherein the aperture defines a rectangular shape.

3. The connector according to claim 1, wherein at least one of the first and second contact tongues defines a contact tab whereby the first and second contact tongues are in electrical contact.

4. The connector according to claim 1, wherein the electrical connection between the first and second terminals allows an electrical monitoring of the correct coupling of the plug connector.

5. The connector according to claim 1, wherein the first and second terminals are connected to corresponding signal lines.

* * * * *